US006885083B2

(12) United States Patent
Dodd et al.

(10) Patent No.: US 6,885,083 B2
(45) Date of Patent: Apr. 26, 2005

(54) DROP GENERATOR DIE PROCESSING

(75) Inventors: Simon Dodd, Corvallis, OR (US); Sean P. McClelland, Corvallis, OR (US); Colby Van Vooren, Corvallis, OR (US); Terry E. McMahon, Corvallis, OR (US); Antonio Cruz-Uribe, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/286,125

(22) Filed: Oct. 31, 2002

(65) Prior Publication Data

US 2004/0087151 A1 May 6, 2004

(51) Int. Cl.[7] .............................................. H01L 23/544

(52) U.S. Cl. ........................................ 257/620; 257/797

(58) Field of Search ................................. 257/620, 797, 257/127, 170, 173, 409, 452, 484, 529, 605

(56) References Cited

U.S. PATENT DOCUMENTS

| | | | |
|---|---|---|---|
| 3,575,740 A | 4/1971 | Castrucci | |
| 4,396,934 A | 8/1983 | Nishida | |
| 4,435,898 A | 3/1984 | Gaur | |
| 4,719,477 A | 1/1988 | Hess | |
| 5,363,134 A | 11/1994 | Barbehenn | |
| 5,635,966 A | 6/1997 | Keefe | |
| 5,652,459 A * | 7/1997 | Chen | 257/529 |
| 5,790,154 A | 8/1998 | Mitani | |
| 5,943,076 A | 8/1999 | Burke et al. | |
| 6,217,155 B1 | 4/2001 | Silverbrook | |
| 6,325,483 B1 | 12/2001 | Harbour | |
| 6,336,714 B1 | 1/2002 | Kawamura | |
| 6,433,405 B1 | 8/2002 | Gunderson | |
| 6,566,735 B1 * | 5/2003 | Minn et al. | 257/620 |

FOREIGN PATENT DOCUMENTS

| | | |
|---|---|---|
| EP | 1078754 A2 | 2/2001 |
| WO | WO 99/03681 | 1/1999 |

OTHER PUBLICATIONS

U.S. Appl. No. 09/932,055, filed Aug. 16, 2001, Thermal Inkjet Printhead Processing With Silicon Etching.

* cited by examiner

*Primary Examiner*—Thien F Tran

(57) ABSTRACT

Processing a die that has an edge and a substrate upon which a layer of moisture permeable material is disposed. The moisture permeable material extends to the edge of the die. One embodiment comprises interrupting the layer of moisture permeable material to form a gap at a boundary near the edge, thereby to substantially block movement of moisture through the gap of the moisture permeable material.

10 Claims, 2 Drawing Sheets

DROP GENERATOR DIE PROCESSING

TECHNICAL FIELD

This invention relates to the production of wafer dies that are eventually used as drop generators in devices such as thermal inkjet printheads, and to a way of processing the dies to reduce the likelihood of delamination of thin film layers on the dies.

BACKGROUND OF THE INVENTION

Drop generators, such as used with inkjet printers for ejecting droplets of ink, are generally formed over an insulated, rigid substrate to define a printhead. The substrate is often part of a conventional silicon wafer that is delineated into an array of individual dies. Each die on the wafer is processed to produce a single printhead. The wafer printhead dies are thereafter separated and incorporated into print cartridges or carriers that connect the printhead with an ink supply.

The printheads are manufactured from selected combinations of thin film layers of material that are deposited or grown on the substrate using processes often adapted from conventional semiconductor component fabrication. In particular, drop generators and associated control circuitry of the printhead are incorporated into and carried on the front surface of the rigid substrate mentioned above. In certain designs, the material comprising at least one of the thin film layers may be permeable to moisture. If portions of such layers are exposed to moisture (such as may occur when the printhead is mounted to the print cartridge), it is possible for the printhead layers to delaminate as the absorbed moisture penetrates and degrades the moisture permeable layer.

DETAILED DESCRIPTION OF EMBODIMENTS

Figure 1:
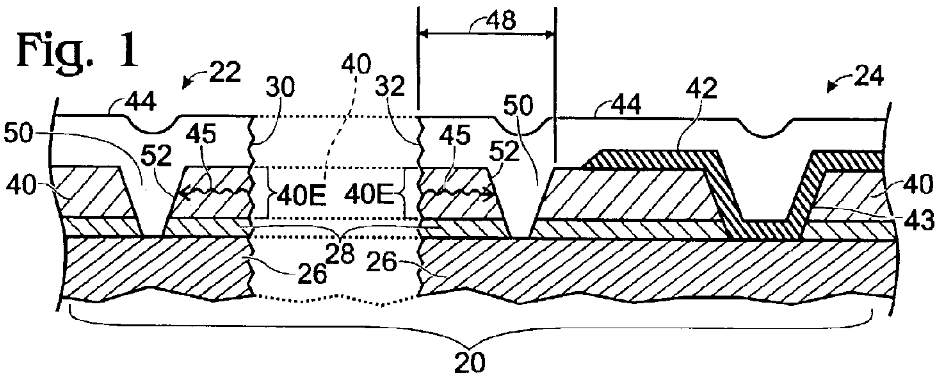
FIG. 1 is a diagram representing a cross section of part of a die that is processed in a manner consistent with an embodiment of the present invention.

Reference is made first to FIG. 1, which diagrammatically illustrates the primary components of concern in describing a preferred embodiment of the present invention. Specifically, the diagram shows a cross section taken at the junction of two adjacent dies 22, 24 that are part of an array of dies on a wafer 20. The dies are depicted in their orientation prior to being separated by conventional techniques, such as by sawing of the wafer.

In a preferred embodiment, each die 22, 24 will eventually be used as an inkjet printhead. Thus, each die carries layers of material, in addition to those shown, that are adapted for moving and chambering ink in the printhead, and for controlled ejections of drops from the ink chamber. These layers, which are generally applied using thin film techniques, include mechanisms for controlling the firing of the resistor that expels the ink drops. Such mechanisms include transistors and associated conductors between the printhead and a controller that is normally carried in the printer. Where pertinent to the present invention, certain of these additional layers are discussed below, primarily in connection with FIGS. 3A–3F. The reader may, however, refer to additional U.S. patents for more information about such printhead construction. Two of these patents are U.S. Pat. Nos. 6,336,714 and 5,635,966.

Before continuing with this description, it is pointed out that FIG. 1 shows only a small portion of the wafer and two adjacent dies 22, 24, including two, substantially parallel adjacent edges 30, 32 of the respective dies 22, 24. In this embodiment, the space between the two edges is removed by conventional wafer sawing techniques to physically define the respective die edges 30, 32 after the die fabrication steps are complete. (Other conventional techniques may be employed for separating the dies from the wafer.) This space aligns with what is designated as a saw street on the wafer prior to separation of the dies. As noted above, for the purposes of explaining this embodiment of the invention, only the die layers adjacent to the edges 30, 32 are discussed in this portion of the description.

In the embodiment shown the wafer 20 generally comprises a silicon substrate 26 upon which is grown a thin silicon oxide 28. A layer of phosphosilicate glass (PSG) 40 covers the oxide on the substrate in the vicinity of the die edges 30, 32 such that, prior to separation of the dies, the layer of PSG 40 extends from one die to the next, across the saw street.

FIG. 1 illustrates the adjacent dies 22, 24 with the layers that pass through the saw street shown in horizontal dotted lines that represent the position of those layers before the dies are sawn apart. The PSG layer 40 is characteristically moisture permeable. As a result, the edge 40E of that layer that is exposed after the dies 22, 24 are sawn apart is susceptible to the penetration of ambient moisture, which penetration is illustrated in FIG. 1 by the wavy arrow 45. The moisture may originate in the ambient air or, in instances where the die is used as a printhead, in the liquid ink or vapor that is in the vicinity of the edge 40E.

In one embodiment, the movement of moisture into a die can have the deleterious effect of disintegrating the PSG layer 40, leading to a delamination of other thin film layers on the die. For example, delamination of the die can cause failure of electrical-signal carrying layers, such as shown as the conductive layer 42 in FIG. 1. As will become clear, embodiments of the present invention tend to prevent such delamination.

It is useful to describe next an exemplary way of fabricating the just-mentioned conductive layer 42, which in FIG. 1 extends through a hole or via 43 in the PSG layer and in the oxide 28 to contact the substrate 26. This via 43 is made by patterning a layer of photoresist material that is laid over the PSG layer 40, and thereafter etching the PSG and oxide to form the via 43. The conductive layer 42 is thereafter deposited over the PSG and into the via 43, and then patterned and etched to the configuration shown in FIG. 1.

In one embodiment, the uppermost layer of the dies 22, 24, such as appears near their respective edges 30, 32, can be referred to as a protective layer 44 comprising, for example, a deposit of passivation material such as SiN covered with SiC.

In accordance with this embodiment, the present invention, the dies 22, 24 are processed with the goal of interrupting the continuity of the moisture permeable PSG layer 40 near the location where that layer may be exposed to moisture, such as the near the edges 30, 32 of the dies. The interruption has the effect of blocking movement of the moisture through the PSG layer 40 (or any other moisture permeable layer interrupted in accord with an embodiment of the present invention).

In one embodiment, a barrier 50 is provided for interrupting or separating the PSG layer 40. In this embodiment, the barrier 50 is very near the exposed edge 30, 32 of each die and, therefore, the path of movement of the moisture 45 is very short, and any attendant delamination of the die near the edge is inconsequential to the operation of the die components.

One way of positioning the barrier 50 to interrupt the PSG layer 40 is to first remove a portion of the PSG layer at a boundary near the edge of the die. In one approach, this is done by further patterning of the photoresist material that is laid over the PSG layer for making the via 43 mentioned above. The PSG layer 40 is then etched to form a gap 52 in that layer (as well as the via), which gap is illustrated in FIG. 1 as the space removed from the PSG layer 40. Depending on the properties of the selected etchant, the underlying oxide layer 28 may also be removed as is also illustrated in FIG. 1. Alternatively, therefore, the oxide layer 28 may remain after the gap 52 is etched.

The gap 52 in the PSG layer is located near the edges 30, 32 of the respective dies and, therefore, underlies the protective layer 44. Accordingly, the deposition of the protective layer (which occurs after the formation of the gap 52) substantially fills the gap with the protective material, thus forming the barrier 50.

It is contemplated that the gap 52 may be located (or the die layers selected) such that material other than that of the protective layer 44 fills the gap 52 to form the barrier 50. For instance, the gap 52 may completely or partially underlie a subsequently deposited metal layer. Accordingly, all or some of the barrier 50 may be metal. It will be appreciated that such barrier material will serve to block moisture movement. For that matter, any material that forms a solid barrier and is not moisture permeable (that is, material that has no affinity for absorbing liquid) will suffice for this embodiment.

The location and size of the barrier 50 may be selected to conform with manufacturing constraints such as mask layout limitations. For example, in a typical inkjet printhead embodiment, the barrier may be 2 μm wide (as measured, for example, left to right in FIG. 1), but can also be much narrower or wider.

Moreover, rather than forming two barriers 50 (that is, one on each die 22, 24) so that the saw street is bounded by a discrete pair of parallel barriers, it is contemplated in one embodiment that all of the PSG layer 40 between the two dies (and across the street) could be removed (as by the patterning and etching steps illustrated in FIGS. 3B and 3C discussed below), thereby providing a single gap within which a strip of barrier material extends continuously from die 22 to die 24 and across the street.

Alternatively, the gap 52 in each die may be formed so that one, inner side of the gap ("inner" being the right side of the gap 52 in die 24; the left side of the gap of die 22) is on one side of the respective die edge, and the other side of the gap resides in the saw street so that in one embodiment after the dies 22, 24 are separated there is no PSG layer remaining at the edges of the dies 22, 24. This approach completely eliminates any path through moisture permeable material at the edge of the die.

In one embodiment, the above-mentioned boundary along which the gap 52 is formed should have an innermost part (that is, the part most distant from the die edge) that is sufficiently spaced from the saw street to ensure that, due to manufacturing tolerances, the actual sawn edge of the die does not reach the layer of PSG 40 that is just inside the barrier 50. Put another way, the barrier should be adequately spaced from the saw street to ensure that the barrier is not inadvertently cut away when the dies are separated. In one embodiment of a printhead die, this space (shown as dimension 48 in FIG. 1) is about 20 μm.

Figure 2:
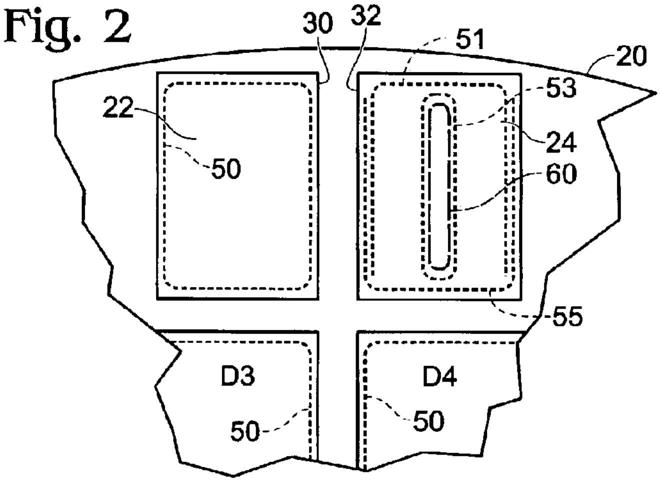
FIG. 2 is another diagram representing a top view of some dies of a wafer, which dies are processed in accord with an embodiment of the present invention.

FIG. 2 diagrams an embodiment of how the barriers on each die are arranged to extend around the periphery of each die 22, 24. That figure shows (at a much smaller scale as compared to that of FIG. 1) the above described exemplary dies 22, 24, as well as cutaway portions of two other dies D3 and D4, in a view that illustrates how the barrier 50 is placed (that is, how the moisture permeable layer 40 is interrupted) along the periphery of three of the illustrated dies 22, D3, D4 of an array of dies carried on the wafer 20. The barrier illustrated on the periphery of die 24 in FIG. 2 is configured in a manner somewhat differently from that of the other dies on the wafer for illustrating another way of providing the barrier. The barrier on that die 24 is formed of two discrete segments 51, 55. This embodiment is used in some applications where it is difficult to form a single continuous barrier around the entire periphery of the die.

In this two-segment arrangement, one barrier segment 55 is formed to define a U-shape substantially around all but one side (the top side in FIG. 2) of the die 24. The other barrier segment 51 is separately formed also to define a U-shape (inverted in FIG. 2) around substantially all but one side of the die (the bottom side in FIG. 2). In this embodiment, the barriers 51, 55, therefore, overlap along the entire length of each opposing side edge of the die. It will be appreciated that in this configuration moisture can move from a side edge into the die by following a very lengthy path along and between the entire overlapped parts of the barriers 51, 55. In one embodiment, this path is sufficiently long for preventing moisture from reaching the interior of the die during the useful life of the die.

This description now turns to the particulars of how die components of interest here are fabricated in a way to carry out the present invention, and reference is made to FIGS. 3A–3F.

Figure 3A:
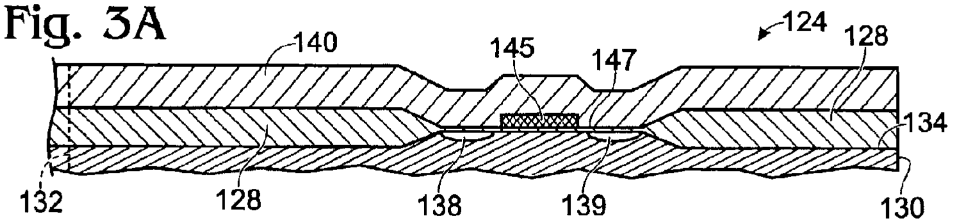
FIGS. 3A–3F are detailed diagrams illustrating one preferred method of processing a die in accordance with an embodiment of the present invention.

FIG. 3A represents a partial assembly of a die 124 corresponding to an intermediate step in one embodiment of the fabrication process. The die 124 is adapted to include the present invention. Any of a number of fabrication methods can be followed to arrive at what is shown and next described with reference to FIGS. 3A–3F. One such process is described in the previously mentioned reference, U.S. Pat. No. 5,635,966.

FIG. 3A shows the front surface 134 of the upper portion of a silicon substrate 130 that is like the substrate 26 described above in connection with FIG. 1. Only a portion of the thickness of the substrate 130 (that is, the upper portion) is depicted in FIGS. 3A–3F.

The substrate in this embodiment is doped to form a source region 138 and drain region 139 of a transistor for controlling an adjacent firing resistor (not shown) of an inkjet printhead. A gate oxide (GOX) layer 147 is provided for defining the transistor gate dielectric layer. Atop the GOX layer 147 there is deposited and patterned a layer of polysilicon 145 to define the gate region of the transistor.

Away from the transistor region, the oxide layer is grown thicker to provide a field oxide (FOX) layer 128 that provides in a printhead the electrical and thermal insulation for isolating individual transistors on the die. In some embodiments, this FOX layer is not required.

The assembly of FIG. 3A also shows a layer of phosphosilicate glass (PSG) 140 that is deposited using, for example, plasma-enhanced chemical vapor deposition (PECVD). The PSG layer 140 can be about 8000 Å thick (the layers not being shown to scale in the figures). Respective to the printhead components of the die, the PSG layer 140 serves as a dielectric layer for isolating the transistor gate 145, source 138, and drain 139 on the substrate 130.

The PSG layer 140 extends over the FOX layer 128, beyond the future edge 132 of the die (that is, the edge that is formed after the die is sawn from the wafer), and across the saw street between adjacent dies and across the future edge of the adjacent die (not shown), as is described above in connection with FIG. 1.

Figure 3B:
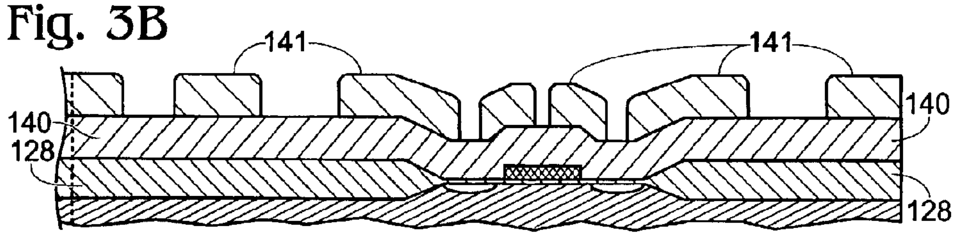
Figure 3C:
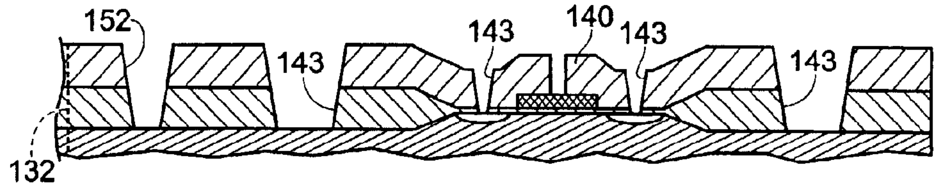

In accordance with this embodiment, and with reference to FIGS. 3B and 3C, the moisture permeable PSG layer 140 is patterned (FIG. 3B) and etched (FIG. 3C) to form the gap 152 in the PSG layer. This patterning and etching preferably is done at the same time (and using the same photomask to create the photoresist layer 141, FIG. 3B) that the PSG layer is patterned and etched to form other components of the die, such as the vias 143 depicted in FIG. 3C. As noted, these vias 143 provide openings where a subsequently deposited metals layer can contact the transistor source, drain, and gate, as well as the substrate. The etching of the PSG layer 140 may be carried out using, for example, a combination of $CF_4$, $CHF_3$, and Ar.

Figure 3D:
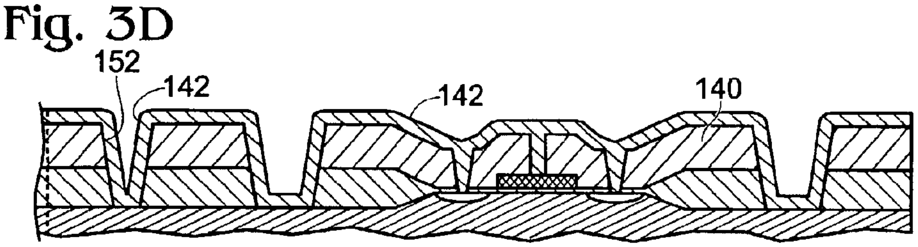
Figure 3E:
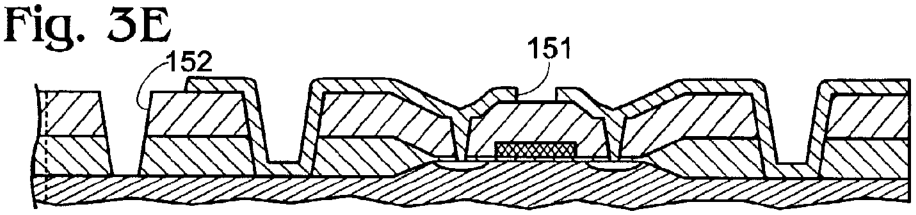

FIG. 3D illustrates a layer 142 comprising two metals. The layer 142 is deposited over the PSG layer 140, patterned using a photomask, and later etched (as at 151, FIG. 3E) for the purpose of providing the conductive lines to carry power to the above mentioned firing resistor, and establish the width of that resistor. Preferably, the metals 142 are deposited in sequence using the same metal deposition tool, with one metal comprising TaAl (about 900 Å thick) and the other comprising AlCu (about 5000 Å thick).

In one preferred embodiment, the metals layer 142 is etched away from the edge 132 of the die (FIG. 3E) and, therefore, does not form part of the material that forms the barrier 250. It is contemplated, however, that the metal layers 142 can be retained in the gap 252 and, along with the protective layer 144 described below, form an effective barrier 250.

Figure 3F:
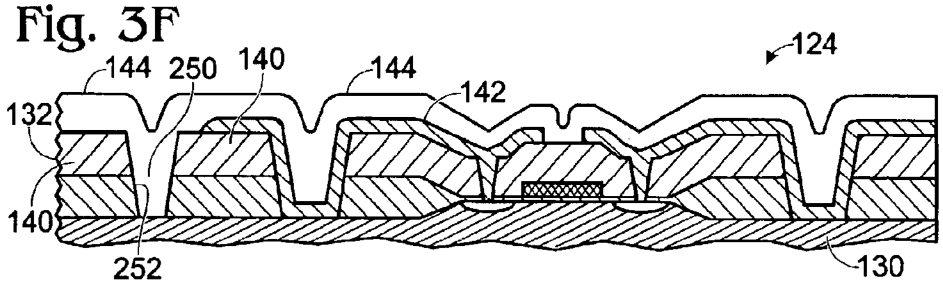

FIG. 3F illustrates the deposition of a protective layer 144. This layer, among other things, covers and protects the printhead resistors from corrosion and other effects that might occur if the resistor were exposed to ink. The protective material may be made up of a deposit of SiN (about 2,500 Å) covered with a deposit of SiC (about 1,250 Å). A conventional PECVD reactor may be employed for this deposition.

In this embodiment of the invention, the protective layer 144 provides the barrier 250 (FIG. 3F) that, as described above, is located and sized for interrupting the moisture permeable layer of PSG 140 and, thus, limiting the length of the possible path for moisture to move in that PSG layer.

In the embodiment shown in FIG. 3F, the barrier 250 seals the PSG layer 140 at the gap 252, extending from the substrate 130 through the gap 252, and over the top surface of the PSG layer 140 in the vicinity of the gap. FIG. 3F also shows the edge of the die 124 after its edge 132 is sawn from the wafer.

It is contemplated that the edge of the die may be one other than that formed when the die is sawn. For instance, such an edge in a substrate may be formed by etching the substrate to make a slot or hole in the substrate for directing ink therethrough. Such an ink-directing slot is illustrated in dashed lines at 60 of the die 24 of FIG. 2. The slot 60 is surrounded with an adjacent barrier 53 that apart from its location otherwise matches the construction of a peripheral barrier 50 as discussed above. Also, openings (such as through substrate interconnects) may be formed from the back to the front of the substrate (through the oxide layer) to pass conductive traces. Such openings also have the potential for exposing part of the moisture permeable material to ambient moisture and also may be isolated with a barrier in accord with the present invention. In any event, the method of the present invention is applicable in any situation where moisture permeable material is exposed, such as may result from any mechanical or chemical action in the vicinity of that material.

It is noteworthy that for dies having a central ink slot (such as appears at 60 in FIG. 2), with the barrier 53, in one embodiment, barriers at the side edges of the dies are also. The side-edge barriers are employed for preventing penetration of ambient moisture into the moisture permeable layer. Also, in a printhead application, the side edges of these dies may be repetitively brushed with the wiper mechanisms of printhead service stations, which can have the effect of delivering small amounts of residual ink into direct contact with the edge. Accordingly, using only a single barrier to surround an ink slot in one embodiment does not address the edge delamination problem identified here.

Figure 4:
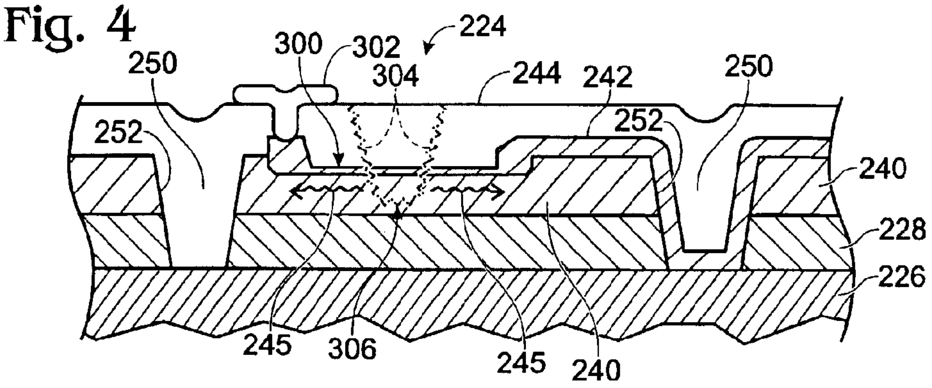
FIG. 4 is a diagram illustrating an alternative application of the present invention in a part of a die that carries a fusible link.

It is contemplated that there are many possible ways of implementing embodiments of the present invention to limit or prevent the movement of moisture in a moisture permeable layer of material, such as PSG, in instances where that material may become exposed to moisture. One alternative embodiment of the present invention is illustrated in FIG. 4, which shows a cross sectional diagram of a portion of a printhead die 224 that carries a fusible link 300. Such links are sometimes used in printhead encoding systems as explained in detail in U.S. Pat. No. 6,325,483.

Respective to embodiments of the present invention, a fusible link 300 is deposited and patterned to reside atop a layer of PSG 240 in a die 224 that may be otherwise constructed in accord with the above discussion of the dies 24, 124. The link 300 is covered with a protective layer 244 similar to the protective layer 144 described above in this embodiment. One part of the link is in electrical communication with a sense line or current source (not shown), such as through contact pad 302. Another part of the link 300 is connected, as by conductor 242, to the encoding circuitry (not shown) on the die 224.

In one embodiment, the identification aspect of some selected links (such as the link 300 under consideration here) is carried out by applying sufficient current through the link to destroy the link in a manner akin to blowing a fuse. The physical effect of blowing the link 300 is to disintegrate part of the link as well as a portion of the protective layer 244 that is adjacent to the link. The absence of this material creates a void (shown as dashed lines 304) that exposes a portion 306 of the PSG layer 240 to ambient moisture, which moisture may include a small amount of residual ink in the vicinity of the fuse. The moisture, if left unchecked, would be absorbed by the moisture permeable PSG layer and penetrate along paths 245 in that layer, thus causing delamination problems in layers elsewhere in the die, as mentioned above.

In accordance with an embodiment of the present invention, the portions of the PSG layer 240 that underlie fusible links 300 are provided with gaps 252 that are filled with material to form a barrier 250. The barrier is formed in substantially the same manner as described above in connection with barrier 152 of FIG. 3, including the etching of the PSG layer 240 to form the gap 252 that is filled and overlaid with another layer to form the barrier 250. In this instance, it will be appreciated that some conductive material 242 may be part of the material that makes up the barrier 250 as is seen in the rightmost part of barrier 250 in FIG. 4. In any event, the boundary of the barrier 250 is established to surround the fusible link 300 so that any moisture penetrating the PSG layer 240 as a result of a blown fusible link will be blocked by the barrier from moving outside of the barrier to other functional parts of the die.

Although the foregoing description has focused on the processing of dies for use in printheads in inkjet printing, it will be appreciated that the present invention may also be applied to the production of dies used in drop generators for any of a variety of applications or fluids. Moreover, although the embodiment of a printhead die was described as incorporating a silicon substrate, it is possible that other rigid substrates, such as glass, will suffice for supporting the remaining layers.

Thus, having here described embodiments of the present invention, the spirit and scope of the invention is not limited to those embodiments, but extend to the various modifications and equivalents of the invention defined in the appended claims.

What is claimed is:

1. A die for a drop generator, comprising:

a substrate;

a moisture permeable layer disposed on the substrate to extend to an edge of the die, the die having a central slot extending through the die including the substrate;

a means for separating the moisture permeable layer to form a gap at a boundary near the edge thereby to block movement of moisture through the gap of the moisture permeable layer of the die, and for surrounding the slot by a moisture impermeable barrier located adjacent to the slot.

2. The die of claim 1 wherein the means for separating is a peripheral barrier that is arranged to extend substantially continuously around the entire periphery of the die.

3. The die of claim 1 wherein the moisture permeable layer is phosphosilicate glass.

4. The die of claim 1 wherein the gap is about 2 μm wide.

5. A die for a drop generator, comprising:

a substrate;

a moisture permeable layer disposed on the substrate to extend to an edge of the die;

a means for separating the moisture permeable layer to form a gap at a boundary near the edge thereby to block movement of moisture through the gap of the moisture layer of the die, wherein the means for separating is a barrier that is spaced about 20 μm from the edge of the die.

6. A die for a drop generator, comprising:

a substrate;

a moisture permeable layer disposed on the substrate to extend to an edge of the die;

a means for separating the moisture permeable layer to form a gap at a boundary near the edge thereby to block movement of moisture through the gap of the moisture permeable layer of the die, wherein the substrate is silicon and wherein the means for separating is a barrier that is arranged to contact the substrate and to substantially cover the moisture permeable layer at the boundary.

7. A die for a drop generator, comprising:

a substrate;

a moisture permeable layer disposed on the substrate to extend to an edge of the die;

a means for separating the moisture permeable layer to form a gap at a boundary near the edge thereby to block movement of moisture through the gap of the moisture permeable layer of the die, wherein the substrate is silicon and wherein the means for separating is a barrier that is arranged to contact the substrate and to substantially cover the moisture permeable layer at the boundary.

8. The die of claim 7 wherein the means for separating is a barrier that is arranged to extend around a fusible member that is carried on the substrate.

9. A die, array for a drop generator, comprising:

a substrate comprising at least two dies that are separated by a saw street that defines a street width, wherein at least one die is formed to have a central slot extending through the die and substrate;

a moisture permeable layer disposed on the at least two dies, the moisture permeable layer including a gap therein between the dies and extending completely across the saw street; and a moisture impermeable barrier substantially surrounding each of the dies and surrounding and located adjacent to the slot and filling at least part of the gap and extending continuously along the saw street thereby to block movement of moisture into the moisture permeable layer of the dies before and after those dies are separated.

10. The die array of claim 9 wherein the barrier is formed of passivation material comprising SiN, SiC, or a combination thereof.

* * * * *